United States Patent
Li et al.

(10) Patent No.: US 10,396,042 B2
(45) Date of Patent: Aug. 27, 2019

(54) DIELECTRIC CRACK STOP FOR ADVANCED INTERCONNECTS

(71) Applicant: International Business Machines Corporation, Armonk, NY (US)

(72) Inventors: Baozhen Li, South Burlington, VT (US); Chih-Chao Yang, Glenmont, NY (US); Griselda Bonilla, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/806,027

(22) Filed: Nov. 7, 2017

(65) Prior Publication Data

US 2019/0139904 A1     May 9, 2019

(51) Int. Cl.
*H01L 23/00* (2006.01)
*H01L 23/48* (2006.01)
*H01L 21/768* (2006.01)

(52) U.S. Cl.
CPC ...... *H01L 23/562* (2013.01); *H01L 21/76805* (2013.01); *H01L 21/76831* (2013.01); *H01L 23/481* (2013.01)

(58) Field of Classification Search
CPC ................. H01L 23/562; H01L 23/481; H01L 21/76831; H01L 21/76805; H01L 21/76835
See application file for complete search history.

(56) References Cited

U.S. PATENT DOCUMENTS

| | | | |
|---|---|---|---|
| 6,677,680 B2 | 1/2004 | Gates et al. | |
| 7,111,149 B2* | 9/2006 | Eilert | G11C 5/02 365/230.01 |
| 7,491,578 B1 | 2/2009 | Shaw et al. | |
| 7,955,952 B2* | 6/2011 | Liu | H01L 23/3171 257/618 |
| 7,955,955 B2 | 6/2011 | Lane et al. | |
| 7,968,450 B2 | 6/2011 | Bhavnagarwala et al. | |
| 8,237,246 B2 | 8/2012 | Angyal et al. | |
| 9,536,842 B2* | 1/2017 | Bao | H01L 23/562 |
| 9,679,855 B1 | 6/2017 | Lee et al. | |

(Continued)

FOREIGN PATENT DOCUMENTS

EP        3116022 A2     1/2017

*Primary Examiner* — Sonya D. McCall-Shepard
(74) *Attorney, Agent, or Firm* — Scully, Scott, Murphy & Presser, P.C.; Alvin Borromeo, Esq.

(57) ABSTRACT

An interconnect level is provided on a surface of a substrate that has improved crack stop capability. The interconnect level includes at least one wiring region including an electrically conductive structure embedded in an interconnect dielectric material having a dielectric constant of less than 4.0, and a crack stop region laterally surrounding the wiring region. The crack stop region includes a crack stop dielectric material having a dielectric constant greater than the dielectric constant of the interconnect dielectric material. The crack stop region may be devoid of any metallic structure, or it may contain a metallic structure. The metallic structure in the crack stop region, which is embedded in the crack stop dielectric material, may be composed of a same, or different, electrically conductive metal or metal alloy as the electrically conductive structure embedded in the interconnect dielectric material.

4 Claims, 5 Drawing Sheets

(56) References Cited

U.S. PATENT DOCUMENTS

| | | | |
|---|---|---|---|
| 2002/0005584 A1* | 1/2002 | Domae | H01L 23/5222 |
| | | | 257/758 |
| 2005/0026397 A1* | 2/2005 | Daubenspeck | H01L 21/31111 |
| | | | 438/465 |
| 2007/0096319 A1 | 5/2007 | Hsu et al. | |
| 2008/0122121 A1 | 5/2008 | Suda et al. | |
| 2013/0043470 A1* | 2/2013 | Huang | H01L 23/562 |
| | | | 257/48 |
| 2013/0062727 A1* | 3/2013 | Huang | H01L 23/3178 |
| | | | 257/506 |
| 2013/0200528 A1* | 8/2013 | Lin | H01L 21/76877 |
| | | | 257/774 |
| 2015/0371956 A1 | 12/2015 | Agarwal et al. | |
| 2017/0162501 A1* | 6/2017 | Yi | H01L 23/5226 |

\* cited by examiner

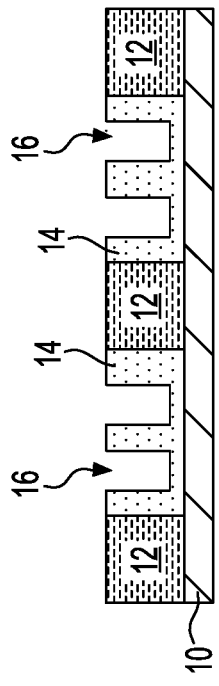
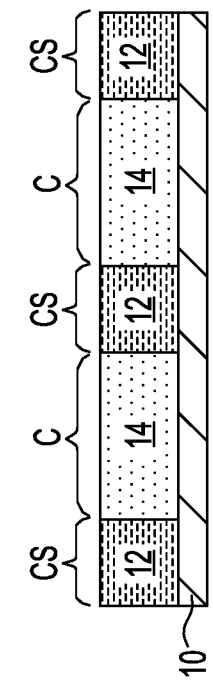
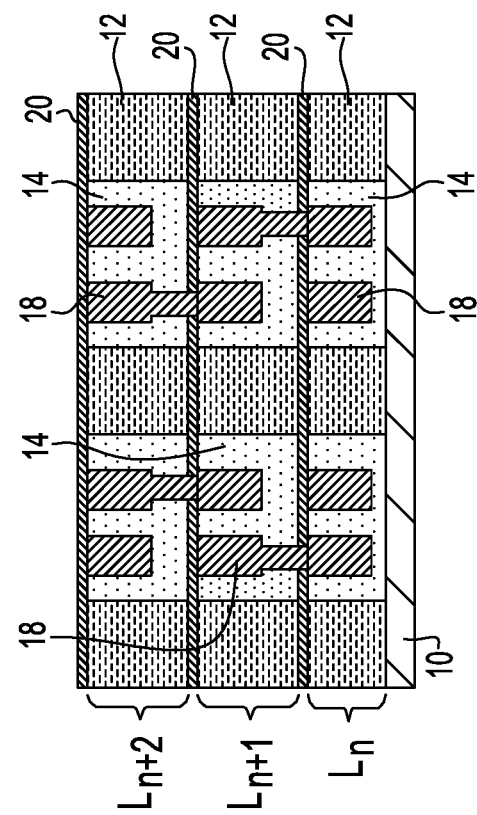
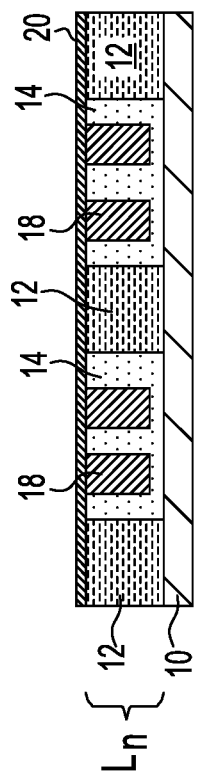

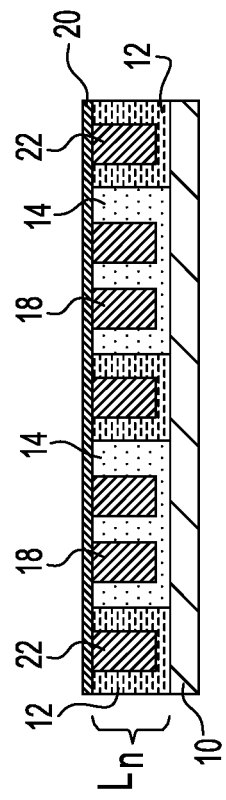
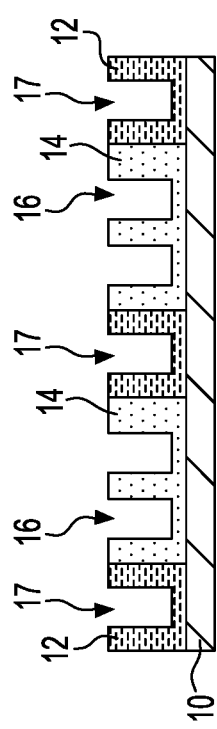
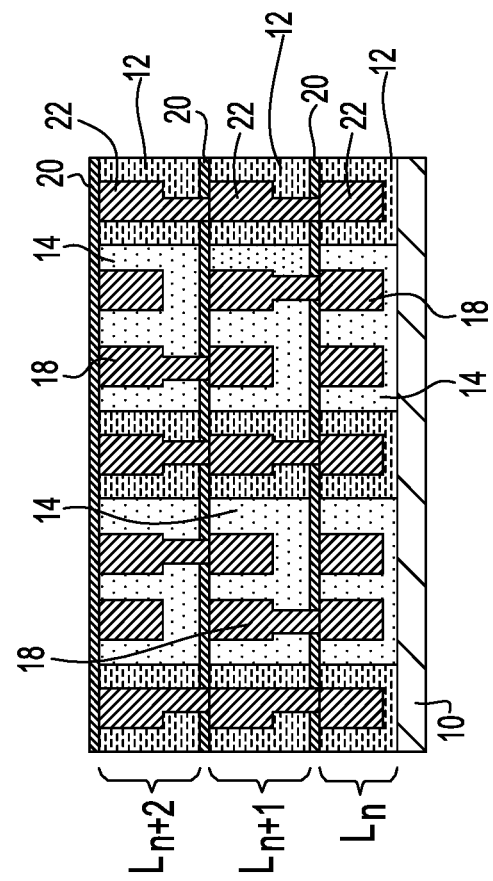

DIELECTRIC CRACK STOP FOR ADVANCED INTERCONNECTS

BACKGROUND

The present application relates to a semiconductor structure and a method of forming the same. More particularly, the present application relates to an interconnect level that includes a crack stop region that laterally surrounds an active device and a wiring region, wherein the crack stop region contains a dielectric material that has a higher dielectric constant than the interconnect dielectric material of the wiring region.

Integrated circuits are generally created by forming an array of electronic devices (i.e., transistors, diodes, resistors, capacitors, etc.) and interconnect wiring structures on a semiconductor substrate. Generally, semiconductor devices and gates are formed in a first layer during front-end-of-line (FEOL) processing, followed by formation of interconnect wiring structures in a second layer by BEOL processes. These first and second layers can each contain multiple layers of dielectric material which electrically isolate the devices and interconnect structures. Advanced BEOL processes utilize interconnect dielectric materials with a low dielectric constant (low-k) to minimize interconnect parasitic capacitances. The term "low-k" is used herein to denote a dielectric material having a dielectric constant of less than 4.0 (i.e., the dielectric constant of silicon dioxide).

After a plurality of integrated circuits (ICs) are formed on a semiconductor wafer, the semiconductor wafer is subjected to a wafer cutting process so as to divide the semiconductor wafer into a plurality of semiconductor chips. The semiconductor chips are then bonded to a substrate package. Due to poor mechanical strength and poor moisture insulation of the low-k interconnect dielectric materials during the wafer cutting and bonding processes, cracks can form and propagate through the interconnect dielectrics toward the active area of the IC chip, causing chip failure.

In order to avoid such crack formation, propagation and structural failure, crack stop regions have been specifically designed which laterally surround each active device and interconnect region. New challenges arise on the crack stop for leading edge technologies. For example, as technologies scale down to 14 nm, 10 nm, 7 nm and beyond, the via sizes at the lower levels become very small (less than, or equal to, 32 nm). The via to line contact area becomes so small that the crack stop toughness may not meet the requirement anymore and result in a crack stop breach. To solve this problem, much larger via (so-called via bars) sizes in the crack stop region are needed. This may cause process window concerns for very different via sizes at different areas of the same interconnect level. There thus exists a need to provide an advanced interconnect structure that has improved crack stop capability.

SUMMARY

An interconnect level is provided on a surface of a substrate which has improved crack stop capability. The interconnect level includes at least one wiring region including an electrically conductive structure embedded in an interconnect dielectric material having a dielectric constant of less than 4.0, and a crack stop region laterally surrounding the wiring region. The crack stop region includes a crack stop dielectric material having a dielectric constant greater than the dielectric constant of the interconnect dielectric material. The crack stop region may be devoid of any metallic structure, or it may contain a metallic structure. The metallic structure in the crack stop region, which is embedded in the crack stop dielectric material, may be composed of a same, or different, electrically conductive metal or metal alloy as the electrically conductive structure embedded in the interconnect dielectric material.

In one aspect of the present application, a semiconductor structure is provided. In one embodiment, the semiconductor structure includes an interconnect level located on a surface of a substrate. The interconnect level includes at least one wiring region including an electrically conductive structure embedded in an interconnect dielectric material having a dielectric constant of less than 4.0, and a crack stop region including a crack stop dielectric material having a dielectric constant greater than the dielectric constant of the interconnect dielectric material and laterally surrounding the at least one wiring region.

In another aspect of the present application, a method of forming a semiconductor structure is provided. In one embodiment, the method may include forming an interconnect level on a surface of a substrate. The interconnect level includes at least one wiring region including an electrically conductive structure embedded in an interconnect dielectric material having a dielectric constant of less than 4.0, and a crack stop region including a crack stop dielectric material having a dielectric constant greater than the dielectric constant of the interconnect dielectric material and laterally surrounding the at least one wiring region.

BRIEF DESCRIPTION OF SEVERAL VIEWS OF THE DRAWINGS

FIG. 1 is a cross sectional view of an exemplary semiconductor structure during an early stage of fabrication and including a precursor (i.e., partially fabricated) first interconnect level located on a surface of a substrate, the precursor first interconnect level includes at least one wiring region including an interconnect dielectric material having a dielectric constant of less than 4.0, and a crack stop region including a crack stop dielectric material having a dielectric constant greater than the dielectric constant of the interconnect dielectric material and laterally surrounding the at least one wiring region.

FIG. 2 is a cross sectional view of the exemplary semiconductor structure of FIG. 1 after forming at least one opening into the interconnect dielectric material.

FIG. 3 is a cross sectional view of the exemplary semiconductor structure of FIG. 2 after forming an electrically conductive structure in the at least one opening to complete the fabrication of a first interconnect level, and forming a dielectric cap on the first interconnect level.

FIG. 4 is a cross sectional view of the exemplary semiconductor structure of FIG. 3 after forming at least one additional interconnect level on the dielectric cap and above the first interconnect level and the substrate.

FIG. 5 is a cross sectional view of the exemplary semiconductor structure of FIG. 1 after forming at least one opening into each of the interconnect dielectric material and the crack stop dielectric material.

FIG. 6 is a cross sectional view of the exemplary semiconductor structure of FIG. 5 after forming a metallic structure in the opening present in the crack stop dielectric material, and an electrically conductive structure in the opening present in the interconnect dielectric material, wherein the metallic structure and the electrically conductive structure comprise a same electrically conductive metal or metal alloy, and forming a dielectric cap on the thus formed first interconnect level.

FIG. 7 is a cross sectional view of the exemplary semiconductor structure of FIG. 6 after forming at least one additional interconnect level on the dielectric cap and above the first interconnect level and the substrate.

DETAILED DESCRIPTION

Figure 8:
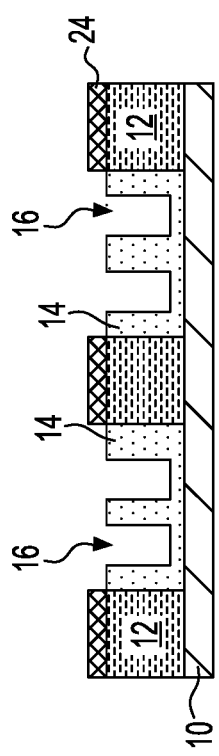
FIG. 8 is a cross sectional view of the exemplary semiconductor structure of FIG. 1 after forming a patterned mask on an exposed surface of each crack stop region, and forming at least one opening into the interconnect dielectric material.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present. All dielectric constants mentioned herein are relative to a vacuum, unless otherwise noted.

Referring now to FIG. 1, there is illustrated an exemplary semiconductor structure during an early stage of fabrication in accordance with an embodiment of the present application. The exemplary semiconductor structure includes a precursor (i.e., partially fabricated) first interconnect level located on a surface of a substrate 10. The precursor first interconnect level includes at least one wiring region, C, including an interconnect dielectric material 14 having a dielectric constant of less than 4.0, and a crack stop region, CS, including a crack stop dielectric material 12 having a dielectric constant greater than the dielectric constant of the interconnect dielectric material 14 and laterally surrounding the at least one wiring region, C. In the drawing, and by way of illustration, two wiring regions, C, are shown.

The substrate 10 may include a semiconductor substrate that includes one or more semiconductor devices formed therein and/or thereupon. The semiconductor substrate may be composed of a semiconductor material having semiconducting properties such as, for example, Si, SiGe, SiGeC, SiC, Ge alloys, III/V compound semiconductors or II/VI compound semiconductors, may be used. In some embodiments, the semiconductor substrate may include a single semiconductor material. In other embodiments, the semiconductor substrate can be a layered semiconductor such as, for example, Si/SiGe, Si/SiC, silicon-on-insulators (SOIs) or silicon germanium-on-insulators (SGOIs).

The one or more semiconductor devices that can be present on and/or in the semiconductor substrate include, but are not limited to, field effect transistors, capacitors, and/or resistors. The one or more semiconductor devices can be formed utilizing well known FEOL processing techniques. So as not to obscure the present application, details concerning the FEOL processing that can be used in providing the one or more semiconductor devices are not provided herein.

In some embodiments, the substrate 10 may also include a middle-of-the-line (MOL) dielectric material that laterally surrounds each semiconductor device. The MOL dielectric material may include one or more contact structures which contact various portions of some of the semiconductor devices. So as not to obscure the present application, details concerning the MOL dielectric material and the contact structure are not provided herein.

After providing the substrate 10, the precursor (i.e., partially fabricated) first interconnect level is formed. The precursor first interconnect level can be formed by first providing a blanket layer of the interconnect dielectric material 14 or a blanket layer of the crack stop dielectric material 12 on substrate 10. Next, the blanket layer of either the interconnect dielectric material 14 or the crack stop dielectric material 12 is patterned to define wiring regions and crack stop regions. Patterning may be performed utilizing any patterning process such as, for example, lithography and etching. Next, the interconnect dielectric material 14 or the crack stop dielectric material 12 is formed into the appropriate region(s). Notably, the interconnect dielectric material 14 is formed into each wiring region, while the crack stop dielectric material 12 is formed into each crack stop region. In some embodiments, a planarization process such as, for example, chemical mechanical planarization (CMP) may be used to ensure that the crack stop dielectric material 12 has a topmost surface that is coplanar with a topmost surface of the interconnect dielectric material 14, as is shown in FIG. 1.

The interconnect dielectric material 14 is composed of a dielectric material having a dielectric constant of less than 4.0. In some embodiments, the interconnect dielectric material 14 is composed of a dielectric material having a dielectric constant of less than 2.8 to about 1.0. In some embodiments, the interconnect dielectric material 14 may be porous. In other embodiments, the interconnect dielectric material 14 may be non-porous. Examples of suitable dielectric materials that may be employed as the interconnect dielectric material 14 include, but are limited to, undoped or doped silicate glass, silsesquioxanes, C doped oxides (i.e., organosilicates) that include atoms of Si, C, O and H, thermosetting polyarylene ethers or any multilayered combination thereof. The term "polyarylene" is used in this present application to denote aryl moieties or inertly substituted aryl moieties which are linked together by bonds, fused rings, or inert linking groups such as, for example, oxygen, sulfur, sulfone, sulfoxide, or carbonyl.

The crack stop dielectric material 12 is composed of a dielectric material having a dielectric constant greater than the dielectric constant of the interconnect dielectric material 14. That is, the crack stop dielectric material 12 is composed of a dielectric material having a dielectric constant of 4.0 or above. In one example, the dielectric constant of the crack stop dielectric material 12 is from 4.0 to 8.0. In some embodiments, the crack stop dielectric material 12 may be porous. In other embodiments, the crack stop dielectric material 12 may be non-porous. Examples of suitable dielectric materials that may be employed as the crack stop dielectric material 12 include, but are not limited to, silicon dioxide, silicon nitride, silicon oxynitride, silicon carbide, nitrogen, oxygen and hydrogen doped silicon carbide, aluminum oxide, aluminum nitride, aluminum oxynitride, hafnium oxide, hafnium nitride, hafnium oxynitride, and any combination or mixture thereof.

The interconnect dielectric material 14 and the crack stop dielectric material 12 may be formed by a deposition process such as, for example, chemical vapor deposition (CVD), plasma enhanced chemical vapor deposition (PECVD) or spin-on coating. The interconnect dielectric material 14 and the crack stop dielectric material 12 may have a thickness from 50 nm to 250 nm. Other thicknesses that are lesser than 50 nm, and greater than 250 nm can also be employed in the present application.

Referring now to FIG. 2, there is illustrated the exemplary semiconductor structure of FIG. 1 after forming at least one opening 16 into the interconnect dielectric material 14. By way of illustration only, two openings 16 are formed into the interconnect dielectric material 14 in each of the wiring regions, C. The at least one opening 16 may be a via opening, a line opening and/or a combined via/line opening. In FIG. 2, each opening 16 is represented as a via opening. In some embodiments, each via opening has a width that is less than, or equal to, 32 nm. The openings 16 may be formed by lithography and etching. In embodiments in which a combined via/line opening is formed, a second iteration of lithography and etching may be used to form such an opening.

In some embodiments, and as shown, each opening 16 stops within the patterned interconnect dielectric material 14. In such an embodiment, a portion of the patterned interconnect dielectric material 14 remains beneath each opening 16. In other embodiments (not shown), each opening 16 may extend entirely through the patterned interconnect dielectric material 14. In such an embodiment, a bottommost surface of each opening 16 may expose a topmost surface of substrate 10.

Referring now to FIG. 3, there is illustrated the exemplary semiconductor structure of FIG. 2 after forming an electrically conductive structure 18 in the at least one opening 16 completing the fabrication of the first interconnect level, $L_n$, and forming a dielectric cap 20 on the first interconnect level, $L_n$.

Each electrically conductive structure 18 includes at least an electrically conductive metal or metal alloy. The electrically conductive structure 18 may optionally include a diffusion barrier material (not specifically shown) and a plating seed layer (not specifically shown).

When present, the diffusion barrier material lines the entirety of the opening 16. The diffusion barrier material may include Ta, TaN, Ti, TiN, Ru, RuN, RuTa, RuTaN, W, WN or any other material that can serve as a barrier to prevent a conductive material from diffusing there through. The thickness of the diffusion barrier material may vary depending on the deposition process used as well as the material employed. In some embodiments, the diffusion barrier material may have a thickness from 2 nm to 50 nm; although other thicknesses for the diffusion barrier material are contemplated and can be employed in the present application as long as the diffusion barrier material does not entirely fill the opening 16. When present, the diffusion barrier material can be formed by a deposition process including, for example, chemical vapor deposition (CVD), plasma enhanced chemical vapor deposition (PECVD), atomic layer deposition (ALD), physical vapor deposition (PVD), sputtering, chemical solution deposition or plating.

In some embodiments, an optional plating seed layer can be formed on the surface of the diffusion barrier material. In cases in which the electrically conductive metal or metal alloy to be subsequently and directly formed on the diffusion barrier material, the optional plating seed layer is not needed. The optional plating seed layer is employed to selectively promote subsequent electroplating of a pre-selected electrically conductive metal or metal alloy. The optional plating seed layer may be composed of Cu, a Cu alloy, Ir, an Ir alloy, Ru, a Ru alloy (e.g., TaRu alloy) or any other suitable noble metal or noble metal alloy having a low metal-plating overpotential. Typically, Cu or a Cu alloy plating seed layer is employed, when a Cu metal is to be subsequently formed within the at least one opening. The thickness of the optional plating seed layer may vary depending on the material of the optional plating seed layer as well as the technique used in forming the same. Typically, the optional plating seed layer has a thickness from 2 nm to 80 nm. The optional plating seed layer can be formed by a conventional deposition process including, for example, CVD, PECVD, ALD, or PVD.

Next, an electrically conductive metal or metal alloy is then formed into each opening 16 and, if present, atop the diffusion barrier material. The electrically conductive metal or metal alloy provides the electrically conductive structure 18 of the present application; electrically conductive structure 18 may be referred to as an interconnect structure since it is embedded in the patterned interconnect dielectric material 14. Examples of electrically conductive metals or metal alloys that may be employed in the present application include, but are not limited to, copper (Cu), aluminum (Al), tungsten (W) and alloys thereof such as, for example, a Cu—Al alloy. The electrically conductive metal or metal alloy that provides each electrically conductive structure 18 can be formed utilizing a deposition process such as, for example, CVD, PECVD, sputtering, chemical solution deposition or plating. In one embodiment, a bottom-up plating process is employed in forming the electrically conductive metal or metal alloy that provides each electrically conductive structure 18. In some embodiments, the electrically conductive metal or metal alloy that provides each electrically conductive structure 18 is formed above the topmost surface of the patterned interconnect dielectric material 14 and above the topmost surface of the crack stop dielectric material 12.

Following the deposition of the electrically conductive metal or metal alloy, a planarization process such as, for example, chemical mechanical polishing (CMP) and/or grinding, can be used to remove all electrically conductive metal or metal alloy (i.e., overburden material) that is present outside each of the openings 16 forming the electrically conductive structures 18 shown in FIG. 2. The planarization stops on the coplanar topmost surface of the interconnect dielectric material 14. Thus, and if present, the planarization process also removes the diffusion barrier material and/or the plating seed layer from the topmost surface of the interconnect dielectric material 14.

Dielectric cap 20 is then formed on the physically exposed topmost surface of the first interconnect level, $L_n$, of the present application. In some embodiments, dielectric cap 20 can be omitted. When present, the dielectric cap 20 may include any dielectric material such as, for example, silicon carbide (SiC), silicon nitride ($Si_3N_4$), silicon dioxide ($SiO_2$), a carbon doped oxide, a nitrogen and hydrogen doped silicon carbide (SiC(N,H)) or a multilayered stack of at least one of the aforementioned dielectric capping materials. The dielectric capping material that provides the dielectric cap 20 may be formed utilizing a deposition process such as, for example, CVD, PECVD, ALD, chemical solution deposition or evaporation. When present, dielectric cap 20 may have a thickness from 10 nm to 100 nm. Other thicknesses that are lesser than 10 nm, or greater than 100 nm may also be used as the thickness of the dielectric cap 20.

FIG. 3 illustrates one exemplary semiconductor structure of the present application. Notably, FIG. 3 illustrates a semiconductor structure that includes an interconnect level, $L_n$, located on a surface of a substrate 10, wherein n is 1. The interconnect level, $L_n$, includes at least one wiring region, C, including an electrically conductive structure 18 embedded in an interconnect dielectric material 14 having a dielectric constant of less than 4.0, and a crack stop region, CS, including a crack stop dielectric material 12 having a dielectric constant greater than the dielectric constant of the interconnect dielectric material 14 and laterally surrounding the at least one wiring region, C. In this example, the crack stop dielectric material 12 and thus the crack stop region, CS, is devoid of any electrically conductive structures (i.e., no electrically conductive metal or metal alloy is embedded in the crack stop dielectric material 12).

Referring now to FIG. 4, there is illustrated the exemplary semiconductor structure of FIG. 3 after forming at least one additional interconnect level, i.e., $L_{n+1}$, $L_{n+2}$, etc., on the dielectric cap 20 and above the first interconnect level, $L_n$, and the substrate 10. Each additional interconnect level, i.e., $L_{n+1}$, $L_{n+2}$, etc., includes a crack stop region containing a crack stop dielectric material 12, as defined above, and at least one wiring region including an interconnect dielectric material 14, as defined above, and an electrically conductive structure 18, as defined above. In this embodiment, the crack stop dielectric materials 12 of the additional interconnect levels are also devoid of any electrically conductive structure. In some embodiments, an electrically conductive structure 18 in an upper interconnect level may extend through the interconnect dielectric material 14 and the underlying dielectric cap 20 and contact a surface of an electrically conductive structure 18 in a lower interconnect level. Each additional interconnect level, i.e., $L_{n+1}$, $L_{n+2}$, etc., can be formed utilizing the processing steps and materials as mentioned above in describing FIGS. 1-3 of the present application. As is shown, a dielectric cap 20 may separate each additional interconnect level, i.e., $L_{n+1}$, $L_{n+2}$, etc., from one another.

FIG. 4 shows a vertical stack of interconnect levels, $L_n$, $L_{n+1}$, $L_{n+2}$, etc, that include vertically aligned crack stop regions and wiring regions. The structure shown in FIG. 3 or FIG. 4 may be subjected to a singulation (i.e., dicing) step. Due to the presence of crack stop dielectric material 12, crack formation and propagation during singulation may be substantially reduced and, in some cases, even eliminated. Another benefit of using crack stop dielectric material 12 is that such a dielectric material can provide improved moisture insulation.

Referring now to FIG. 5, there is illustrated the exemplary semiconductor structure of FIG. 1 after forming at least one opening (16, 17) into each of the interconnect dielectric material 14 and the crack stop dielectric material 12. The opening 16 that is formed into the interconnect dielectric material 14 may be referred to as an interconnect opening, while opening 17 formed into the crack stop dielectric material 12 may be referred to as a crack stop opening. Each opening (16, 17) has either the same or different dimensions, i.e., depth and width. Each opening (16, 17) is formed by lithography and etching. Each opening (16, 17) may be a via opening, line opening or combined via/line opening. In FIG. 5 and by way of one example, each opening (16, 17) is shown as a via opening. In some embodiments, the via openings may have a width that is less than, or equal to, 32 nm.

Referring now to FIG. 6, there is illustrated the exemplary semiconductor structure of FIG. 5 after forming a metallic structure 22 in the opening 17 present in the crack stop dielectric material 12, and an electrically conductive structure 18 in the opening 16 present in the interconnect dielectric material 14 to complete the fabrication of a first interconnect level, $L_n$. In this embodiment, the metallic structure 22 and the electrically conductive structure 18 comprise a same electrically conductive metal or metal alloy. Dielectric cap 20 can then be formed the first interconnect level, $L_n$. In some embodiments, dielectric cap 20 may be omitted.

Each electrically conductive structure 18 and each metallic structure 22 includes at least an electrically conductive metal or metal alloy. Each electrically conductive structure 18 and each metallic structure 22 may optionally include a diffusion barrier material (not specifically shown) and a plating seed layer (not specifically shown).

The optional diffusion barrier material, optional plating seed layer and electrically conductive metal or metal alloy that can be used in this embodiment are the same as described above in regard to FIG. 3 of the present application. The processing mentioned above for forming each of optional diffusion barrier material, optional plating seed layer and electrically conductive metal or metal alloy that can be used in this embodiment are the same as described above in regard to FIG. 3 of the present application.

Dielectric cap 20 of this embodiment may include one of the dielectric capping materials mentioned above. Also, dielectric cap 20 of this embodiment may be formed utilizing one of the deposition processes mentioned above for forming dielectric cap 20 shown in FIG. 3.

Each electrically conductive structure 18 and each metallic structure 22 has a topmost surface that is coplanar with each other as well as being coplanar with topmost surfaces of both the crack stop dielectric material 12 and the interconnect dielectric material 14.

FIG. 6 illustrates another exemplary semiconductor structure of the present application. Notably, FIG. 6 illustrates a semiconductor structure that includes an interconnect level, $L_n$, located on a surface of a substrate 10, wherein n is 1. The interconnect level, $L_n$, includes at least one wiring region, C, including an electrically conductive structure 18 embedded in an interconnect dielectric material 14 having a dielectric constant of less than 4.0, and a crack stop region, CS, including a crack stop dielectric material 12 having a dielectric constant greater than the dielectric constant of the interconnect dielectric material 14 and laterally surrounding the at least one wiring region, C. In this example, the crack stop dielectric material 12 includes a metallic structure 22 that is composed of a same electrically conductive metal or metal alloy as electrically conductive structure 18.

Referring now to FIG. 7, there is illustrated the exemplary semiconductor structure of FIG. 6 after forming at least one additional interconnect level, i.e., $L_{n+1}$, $L_{n+2}$, etc., on the dielectric cap 20 and above the first interconnect level, $L_n$, and the substrate 10. Each additional interconnect level, i.e., $L_{n+1}$, $L_{n+2}$, etc., includes a crack stop region containing a crack stop dielectric material 12, as defined above, a metallic structure 22, as defined above embedded in the crack stop dielectric material 12, and at least one wiring region including an interconnect dielectric material 14, as defined above, and an electrically conductive structure 18, as defined above. In some embodiments, an electrically conductive structure 18 in an upper interconnect level may extend through the interconnect dielectric material 14 and the underlying dielectric cap 20 and contact a surface of an electrically conductive structure 18 in a lower interconnect level. In some embodiments, a metallic structure 22 in an upper interconnect level may extend through the crack stop dielectric material 12 and the underlying dielectric cap 20 and contact a surface of a metallic structure 22 in a lower interconnect level. Each additional interconnect level, i.e., $L_{n+1}$, $L_{n+2}$, etc., can be formed utilizing the processing steps and materials as mentioned above in describing FIGS. 5-6 of the present application. As is shown, a dielectric cap 20 may separate each additional interconnect level, i.e., $L_{n+1}$, $L_{n+2}$, etc., from one another.

FIG. 7 shows a vertical stack of interconnect levels, $L_n$, $L_{n+1}$, $L_{n+2}$, etc, that include vertically aligned crack stop regions and wiring regions. The structure shown in FIG. 7 or FIG. 6 may be subjected to a singulation (i.e., dicing) step. Due to the presence of crack stop dielectric material 12 and the metallic structure 22, crack formation and propagation during singulation may be substantially reduced and, in some cases, even eliminated. Another benefit of using crack stop dielectric material 12 is that such a dielectric material can provide improved moisture insulation.

Referring now to FIG. 8, there is illustrated the exemplary semiconductor structure of FIG. 1 after forming a patterned mask 24 on an exposed surface of the crack stop dielectric material 12 in each crack stop region, CS, and forming at least one opening 16 into the interconnect dielectric material 14.

The patterned mask 24 may be composed of a hard mask dielectric material that is different in composition from the dielectric material that provides either the crack stop dielectric material 12 and the interconnect dielectric material 14. In one embodiment, the patterned mask 24 is composed of silicon nitride. The patterned mask 24 may be formed by deposition of a blanket hard mask dielectric material and thereafter patterning the blanket layer of hard mask dielectric material to provide the patterned mask 24. The patterning may be performed utilizing lithography and etching. In another embodiment, the patterned mask 24 may be a photoresist material that has been deposited and subjected to lithography.

The opening 16 can be formed utilizing lithography and etching. Opening 16 may be a via opening, line opening, or combined via/line opening. Via openings are shown in FIG. 8 by way of one example. In some embodiments, each via opening may have a width that is less than, or equal to, 32 nm.

Figure 9:
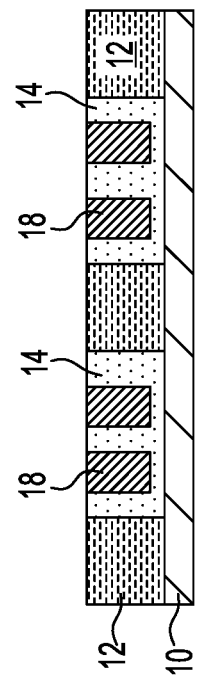
FIG. 9 is a cross sectional view of the exemplary semiconductor structure of FIG. 8 after removing the patterned mask and forming an electrically conductive structure containing a first electrically conductive metal or metal alloy in the at least one opening provided in the interconnect dielectric material.

Referring now to FIG. 9, there is illustrated the exemplary semiconductor structure of FIG. 8 after removing the patterned mask 24, and then forming an electrically conductive structure 18 containing a first electrically conductive metal or metal alloy in the at least one opening 16 provided in the interconnect dielectric material 14.

The patterned mask 24 may be removed utilizing any material removal process including, for example, etching or planarization. In some embodiments, the patterned mask 24 may be removed after forming the electrically conductive structure 18 in the interconnect dielectric material 14. In such an embodiment, the patterned mask 24 may be removed during, or after, the removal of any overburdened material that is formed outside opening 16.

Each electrically conductive structure 18 includes at least the first electrically conductive metal or metal alloy. Each electrically conductive structure 18 may optionally include a diffusion barrier material (not specifically shown) and a plating seed layer (not specifically shown). The first electrically conductive metal or metal alloy includes one of the electrically conductive metals or metal alloys mentioned above for providing electrically conductive structure 18 shown in FIG. 3. The first electrically conductive metal or metal alloy can be formed utilizing one of the techniques mentioned above in forming the metal or metal alloy that provides the electrically conductive structures 18 shown in FIG. 3. The optional diffusion barrier material and optional plating seed layer may include materials and can be formed utilizing processes, as mentioned above.

After deposition of the optional diffusion barrier material, optional plating seed layer and first electrically conductive metal or metal alloy, a planarization process can be performed to provide the exemplary structure shown in FIG. 9.

Figure 10:
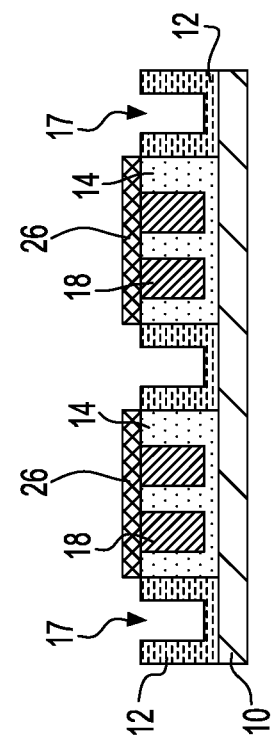
FIG. 10 is a cross sectional view of the exemplary semiconductor structure of FIG. 9 after forming a patterned mask over each wiring region, and forming at least one opening in the crack stop dielectric material.

Referring now to FIG. 10, there is illustrated the exemplary semiconductor structure of FIG. 9 after forming a patterned mask 26 over each wiring region, C, and forming at least one opening 17 in the crack stop dielectric material 12. Patterned mask 26 may include one of the mask materials mentioned above for providing patterned mask 24. Patterned mask 26 may formed utilizing one of the techniques mentioned above in forming patterned mask 24.

The at least one opening 17 can be formed by lithography and etching. Typically each opening 17 is of a same type, i.e., via opening, as opening 16. Also, each opening 17 typically has a same depth and, even possibly, the same width as each opening 16.

Figure 11:
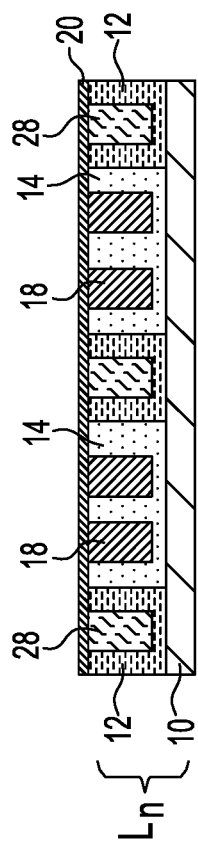
FIG. 11 is a cross sectional view of the exemplary semiconductor structure of FIG. 10 after removing the patterned mask and forming a metallic structure containing a second electrically metal or metal alloy, different from the first electrically conductive metal or metal alloy, in the at least one opening provided in the crack stop dielectric material.

Referring now to FIG. 11, there is illustrated the exemplary semiconductor structure of FIG. 10 after removing the patterned mask 26 and forming a metallic structure 28 containing a second electrically conductive metal or metal alloy, different from the first electrically conductive metal or metal alloy, in the at least one opening 17 provided in the crack stop dielectric material 12. Dielectric cap 20 is formed over the fabricated first interconnect level, $L_n$, of this embodiment of the present application. In some embodiments, dielectric cap 20 may be omitted.

The patterned mask 26 may be removed utilizing any material removal process including, for example, etching or planarization. In some embodiments, the patterned mask 26 may be removed after forming the metallic structure 28 in the crack stop dielectric material 12. In such an embodiment, the patterned mask 26 may be removed during, or after, the removal of any overburdened material that is formed outside opening 17.

Each metallic structure 28 includes at least the second electrically conductive metal or metal alloy. Each metallic structure 28 may optionally include a diffusion barrier material (not specifically shown) and a plating seed layer (not specifically shown). The second electrically conductive metal or metal alloy includes one of the electrically conductive metals or metal alloys mentioned above for providing electrically conductive structure 18 shown in FIG. 3 provided that the second electrically conductive metal or metal alloy differs from the first electrically conductive metal or metal alloy that provides electrically conductive structure 18. In one example, each metallic structure 28 is composed of W, while each electrically conductive structure 18 is composed of Cu. The second electrically conductive metal or metal alloy can be formed utilizing one of the techniques mentioned above in forming the metal or metal alloy that provides the electrically conductive structures 18 shown in FIG. 3. The optional diffusion barrier material and optional plating seed layer may include materials and can be formed utilizing processes, as mentioned above.

After deposition of the optional diffusion barrier material, optional plating seed layer and second electrically conductive metal or metal alloy, a planarization process can be performed to provide the exemplary structure shown in FIG. 11. Although the present application describes and illustrates the formation of the electrically conductive structure 18 prior to the metallic structure 28, the processing steps described herein can be reversed such that the metallic structure 28 is formed prior to the electrically conductive structure 18.

Dielectric cap 20, as defined above, is then formed on the first interconnect level, $L_n$, of this embodiment of the present application.

FIG. 11 illustrates yet another exemplary semiconductor structure of the present application. Notably, FIG. 11 illustrates a semiconductor structure that includes an interconnect level, $L_n$, located on a surface of a substrate 10, wherein n is 1. The interconnect level, $L_n$, includes at least one wiring region, C, including an electrically conductive structure 18 embedded in an interconnect dielectric material 14 having a dielectric constant of less than 4.0, and a crack stop region, CS, including a crack stop dielectric material 12 having a dielectric constant greater than the dielectric constant of the interconnect dielectric material 14 and laterally surrounding the at least one wiring region, C. In this example, the crack stop dielectric material 12 includes a metallic structure 28 that is composed of a different electrically conductive metal or metal alloy as electrically conductive structure 18.

Figure 12:
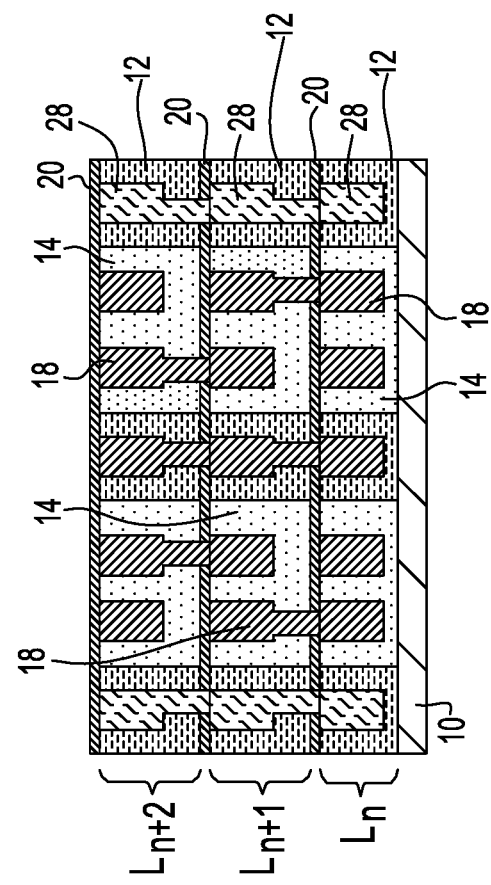
FIG. 12 is a cross sectional view of the exemplary semiconductor structure of FIG. 11 after forming at least one additional interconnect level on the dielectric cap and above the thus formed first interconnect level and the substrate.

Referring now to FIG. 12, there is illustrated the exemplary semiconductor structure of FIG. 11 after forming at least one additional interconnect level, i.e., $L_{n+1}$, $L_{n+2}$, etc., on the dielectric cap 20 and above the first interconnect level, $L_n$, and the substrate 10. Each additional interconnect level, i.e., $L_{n+1}$, $L_{n+2}$, etc., includes a crack stop region containing a crack stop dielectric material 12, as defined above, a metallic structure 28, as defined above embedded in the crack stop dielectric material 12, and at least one wiring region including an interconnect dielectric material 14, as defined above, and an electrically conductive structure 18, as defined above. In some embodiments, an electrically conductive structure 18 in an upper interconnect level may extend through the interconnect dielectric material 14 and the underlying dielectric cap 20 and contact a surface of an electrically conductive structure 18 in a lower interconnect level. In some embodiments, a metallic structure 28 in an upper interconnect level may extend through the crack stop dielectric material 13 and the underlying dielectric cap 20 and contact a surface of a metallic structure 28 in a lower interconnect level. Each additional interconnect level, i.e., $L_{n+1}$, $L_{n+2}$, etc., can be formed utilizing the processing steps and materials as mentioned above in describing FIGS. 5-6 of the present application. As is shown, a dielectric cap 20 may separate each additional interconnect level, i.e., $L_{n+1}$, $L_{n+2}$, etc., from one another.

FIG. 12 shows a vertical stack of interconnect levels, $L_n$, $L_{n+1}$, $L_{n+2}$, etc, that include vertically aligned crack stop regions and wiring regions. The structure shown in FIG. 11 or FIG. 12 may be subjected to a singulation (i.e., dicing) step. Due to the presence of crack stop dielectric material 12 and the metallic structure 28, crack formation and propagation during singulation may be substantially reduced and, in some cases, even eliminated. Another benefit of using crack stop dielectric material 12 is that such a dielectric material can provide improved moisture insulation.

Figure 13:
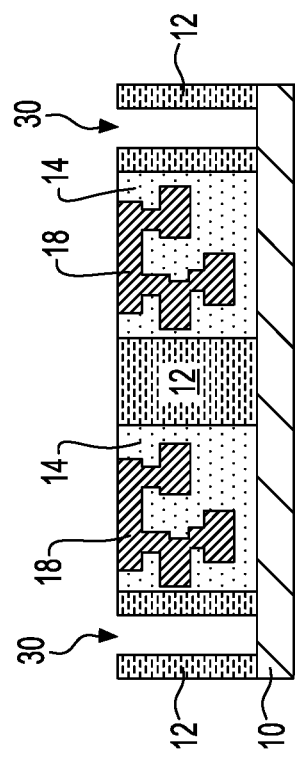
FIG. 13 is a cross sectional view of an exemplary semiconductor structure during an early stage of fabrication and including a precursor first interconnect level located on a surface of a substrate, the precursor first interconnect level includes at least one wiring region including an electrically conductive structure embedded in an interconnect dielectric material having a dielectric constant of less than 4.0, and a crack stop region including a crack stop dielectric material having a dielectric constant greater than the dielectric constant of the interconnect dielectric material and laterally surrounding the at least one wiring region.

Referring now to FIG. 13, there is illustrated an exemplary semiconductor structure during an early stage of fabrication and including a first interconnect level, $L_n$, located on a surface of a substrate 10. In this embodiment, the first interconnect level, $L_n$, includes at least one wiring region, C, including an electrically conductive structure 18, as defined above, embedded in an interconnect dielectric material 14, as defined above, and having a dielectric constant of less than 4.0, and a crack stop region, CS, including a crack stop dielectric material 12, as defined above, and having a dielectric constant greater than the dielectric constant of the interconnect dielectric material and laterally surrounding the at least one wiring region, C.

The exemplary semiconductor structure shown in FIG. 13 can be formed utilizing the basic processing steps shown in FIGS. 8 and 9 of the present application. In this embodiment, the openings that include the electrically conductive structure 18 includes multiple combined via and line openings.

Figure 14:
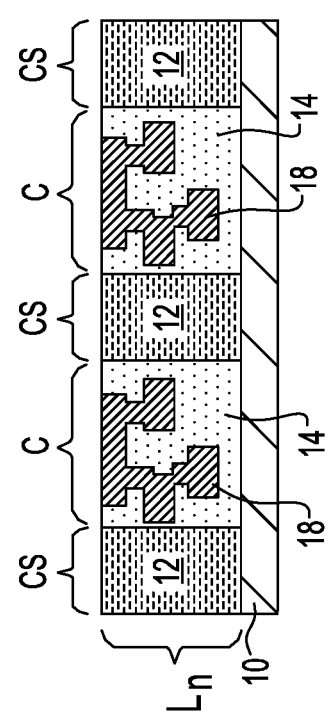
FIG. 14 is a cross sectional view of the exemplary semiconductor structure of FIG. 13 after forming an opening in, and extending completely through, the crack stop dielectric material.

Referring now to FIG. 14, there is illustrated the exemplary semiconductor structure of FIG. 13 after forming an opening 30 in, and extending completely through, the crack stop dielectric material 12. In some embodiments, the opening 30 is a via opening that has a different dimensions than the electrically conductive structures 18. The opening 30 can be formed by lithography and etching. The etching is typically an anisotropic etch that stops on a topmost surface of substrate 10.

Figure 15:
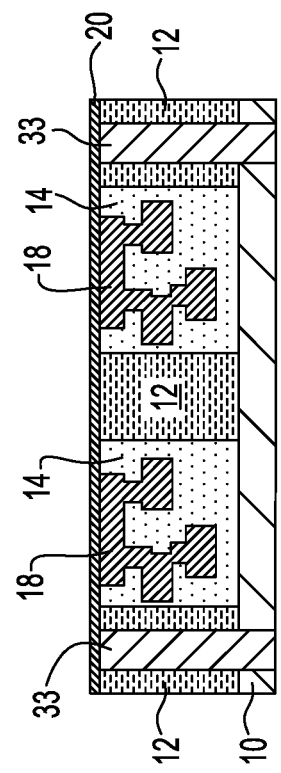
FIG. 15 is a cross sectional view of the exemplary semiconductor structure of FIG. 14 after forming a metallic structure in the opening to complete the fabrication of a first interconnect level, and forming a dielectric cap on the thus formed first interconnect level.

Referring now to FIG. 15, there is illustrated the exemplary semiconductor structure of FIG. 14 after forming a metallic structure 32 in the opening 30, and forming a dielectric cap 20 on the thus formed first interconnect level, $L_n$. In some embodiments, dielectric cap 20 formation may be omitted. The metallic structure 32 may include a same or different electrically conductive metal or metal alloy as electrically conductive structure 18. For example, the metallic structure 32 and the electrically conductive structure 18 may be both composed of Cu. In another example, the metallic structure 32 may be composed of W, while the electrically conductive structure 18 may be composed of Cu. The metallic structure 32 can be formed by depositing an electrically conductive metal or metal alloy in the opening 30. A planarization process may follow the deposition of the electrically conductive metal or metal alloy so as to provide metallic structure 30 in the crack stop dielectric material 12. In this embodiment, the metallic structure 32 and the electrically conductive structure 18 have topmost surfaces that are coplanar with each other as well as being coplanar with the topmost surfaces of the crack stop dielectric material 12 and the interconnect dielectric material 14.

Dielectric cap 20 may include one of the dielectric capping material mentioned above and it can be formed utilizing one of the deposition processes as also mentioned herein above.

Figure 16:
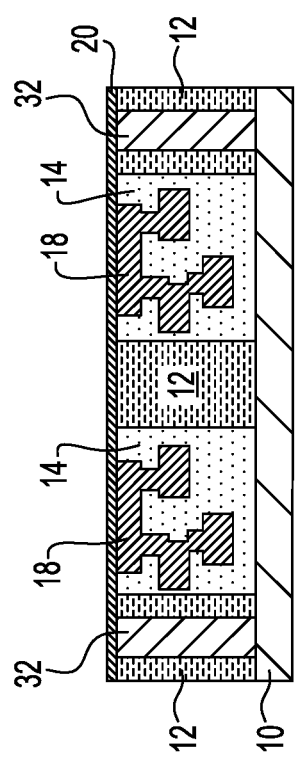
FIG. 16 is a cross sectional view of the exemplary semiconductor structure of FIG. 15 after forming an opening in the substrate which physically exposes a bottommost surface of the metallic structure, and then filling the opening with a same electrically conductive metal or metal alloy to provide a through-via metallic structure.

Referring now to FIG. 16, there is illustrated the exemplary semiconductor structure of FIG. 15 after forming an opening in the substrate 10 which physically exposes a bottommost surface of the metallic structure 30, and then filling the opening with a same electrically conductive metal or metal alloy to provide a through-via metallic structure 33. The opening is formed into the substrate 10 can be formed by lithography and etching. The filling of the opening formed into substrate 10 can be performed utilizing a deposition process as mentioned above. A planarization process such as, chemical mechanical planarization, may follow the filling of the opening formed into substrate 10.

FIG. 16 illustrates yet another exemplary semiconductor structure of the present application. Notably, FIG. 16 illustrates a semiconductor structure that includes an interconnect level, $L_n$, located on a surface of a substrate 10, wherein n is 1. The interconnect level, $L_n$, includes at least one wiring region, C, including an electrically conductive structure 18 embedded in an interconnect dielectric material 14 having a dielectric constant of less than 4.0, and a crack stop region, CS, including a crack stop dielectric material 12 having a dielectric constant greater than the dielectric constant of the interconnect dielectric material 14 and laterally surrounding the at least one wiring region, C. In this example, the crack stop dielectric material 12 includes a metallic structure 33 that is composed of a same or different electrically conductive metal or metal alloy as electrically conductive structure 18. In this embodiment, the metallic structure 33 extends completely through the crack stop dielectric material 12 and the substrate 10.

Although not shown, it is possible to form at least one additional interconnect level, i.e., $L_{n+1}$, $L_{n+2}$, etc., on the dielectric cap 20 and above the first interconnect level, $L_n$, and the substrate 10 shown in FIG. 16. Each additional interconnect level, i.e., $L_{n+1}$, $L_{n+2}$, etc., includes a crack stop region containing a crack stop dielectric material 12, as defined above, a metallic structure 33, as defined above embedded in the crack stop dielectric material 12, and at least one wiring region including an interconnect dielectric material 14, as defined above, and an electrically conductive structure 18, as defined above. In some embodiments, an electrically conductive structure 18 in an upper interconnect level may extend through the interconnect dielectric material 14 and the underlying dielectric cap 20 and contact a surface of an electrically conductive structure 18 in a lower interconnect level. In some embodiments, a metallic structure 33 in an upper interconnect level may extend through the crack stop dielectric material 12 and the underlying dielectric cap 20 and contact a surface of a metallic structure 33 in a lower interconnect level. Each additional interconnect level, i.e., $L_{n+1}$, $L_{n+2}$, etc., can be formed utilizing the processing steps and materials as mentioned above in describing FIGS. 5-6 of the present application. As is shown, a dielectric cap 20 may separate each additional interconnect level, i.e., $L_{n+1}$, $L_{n+2}$, etc., from one another.

The structure shown in FIG. 16 or the one described above including multiple interconnect level formed atop the structure shown in FIG. 16 may be subjected to a singulation (i.e., dicing) step. Due to the presence of crack stop dielectric material 12 and the metallic structure 30, crack formation and propagation during singulation may be substantially reduced and, in some cases, even eliminated. Another benefit of using crack stop dielectric material 12 is that such a dielectric material can provide improved moisture insulation.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
an interconnect level located on a surface of a substrate and comprising at least one wiring region comprising an electrically conductive structure embedded in an interconnect dielectric material having a dielectric constant of less than 4.0, and a crack stop region comprising a crack stop dielectric material having a dielectric constant greater than the dielectric constant of the interconnect dielectric material and laterally surrounding the at least one wiring region, wherein an entirety of the crack stop dielectric material is devoid of an electrically conductive metal or metal alloy.

2. The semiconductor structure of claim 1, wherein the interconnect dielectric material has a topmost surface that is coplanar with a topmost surface of the crack stop dielectric material.

3. The semiconductor structure of claim 1, further comprising a dielectric cap located on the interconnect level.

4. The semiconductor structure of claim 1, further comprising at least one other interconnect level located above the interconnect level and the substrate, wherein the at least one other interconnect level comprises:

at least one other wiring region comprising an electrically conductive structure embedded in an interconnect dielectric material having a dielectric constant of less than 4.0, and at least one other crack stop region comprising a crack stop dielectric material having a dielectric constant greater than the dielectric constant of the interconnect dielectric material of the at least one other wiring region and laterally surrounding the at least one other wiring region, wherein an entirety of each of the crack stop dielectric materials is devoid of a metal or metal alloy.

* * * * *